United States Patent
Smith et al.

(10) Patent No.: US 9,494,641 B2
(45) Date of Patent: Nov. 15, 2016

(54) DEGRADATION DETECTOR AND METHOD OF DETECTING THE AGING OF AN INTEGRATED CIRCUIT

(71) Applicant: Nvidia Corporation, Santa Clara, CA (US)

(72) Inventors: Brian Smith, Santa Clara, CA (US); Stephen Felix, Cambridge (GB); Tezaswi Raja, Santa Clara, CA (US); Roman Surgutchik, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 358 days.

(21) Appl. No.: 14/163,066

(22) Filed: Jan. 24, 2014

(65) Prior Publication Data

US 2015/0212149 A1 Jul. 30, 2015

(51) Int. Cl.
*G01R 31/28* (2006.01)
*G01R 31/317* (2006.01)
*H03K 3/03* (2006.01)
*G01R 1/30* (2006.01)

(52) U.S. Cl.
CPC ............ *G01R 31/2858* (2013.01); *G01R 1/30* (2013.01); *G01R 31/2837* (2013.01); *G01R 31/2851* (2013.01); *G01R 31/31727* (2013.01); *H03K 3/0315* (2013.01)

(58) Field of Classification Search
CPC ............ H03K 3/0315; G01R 31/2858; G01R 31/2856; G01R 31/2851; G01R 31/2882; G01R 31/317; G01R 31/31725; G01R 31/31721; G01R 31/31727
USPC ....................................................... 331/57, 44
See application file for complete search history.

(56) References Cited

U.S. PATENT DOCUMENTS

| 7,205,854 | B2 * | 4/2007 | Liu | G01R 31/31727 324/750.3 |
| 7,495,519 | B2 * | 2/2009 | Kim | G01R 31/31725 331/44 |
| 7,501,845 | B2 * | 3/2009 | Muniandy | G06F 1/04 324/750.3 |
| 8,081,003 | B2 * | 12/2011 | Pacha | G01R 31/3181 324/537 |
| 8,229,683 | B2 * | 7/2012 | Gebara | G01R 31/31725 702/42 |

OTHER PUBLICATIONS

Keane, J., and C. H. Kim. "Transistor Aging." IEEE Spectrum, May (2011).

* cited by examiner

*Primary Examiner* — Ryan Johnson

(57) ABSTRACT

A degradation detector for an integrated circuit (IC), a method of detecting aging in an IC and an IC incorporating the degradation detector or the method. In one embodiment, the degradation detector includes: (1) an offline ring oscillator (RO) coupled to a power gate and a clock gate, (2) a frozen RO coupled to a clock gate, (3) an online RO and (4) an analyzer coupled to the offline RO, the frozen RO and the online RO and operable to place the degradation detector in a normal state in which the offline RO is disconnected from both the drive voltage source and the clock source, the frozen RO is connected to the drive voltage source but disconnected from the clock source and the online RO is connected to both the drive voltage source and the clock source.

20 Claims, 3 Drawing Sheets

DEGRADATION DETECTOR AND METHOD OF DETECTING THE AGING OF AN INTEGRATED CIRCUIT

CROSS-REFERENCE TO RELATED APPLICATION

This application is related to U.S. patent application Ser. No. 13/723,139 filed by Kumar, et al., on Dec. 20, 2012, entitled "Quantifying Silicon Degradation in an Integrated Circuit," jointly assigned with this application and incorporated herein by reference.

TECHNICAL FIELD

This application is directed, in general, to integrated circuits (ICs) and, more specifically, to a system and method of detecting the degradation of an IC over time.

BACKGROUND

Over the lifetime of an IC, various mechanisms result in the degradation of transistors, other components and interconnects of an IC. Hot-carrier injection (HCI) occurs when charge carriers (electrons or holes), propelled by excess kinetic energy, stray into a nonconductive region of a transistor, such as the gate dielectric of a metal-oxide semiconductor field-effect transistor (MOSFET). Bias temperature instability (BTI) results from applying the same voltage to the control terminal of a transistor over time. Subsequent toggling of the transistor has to overcome the resulting voltage bias, slowing its switching speed. Charge traps, which are pockets of conduction in a dielectric layer, can be formed over time and eventually cause the dielectric to break down and form a short circuit in a transistor. Electromigration occurs when voltage surges cause electrons in the interconnects to drift into the transistors and remain there.

Degradation caused by HCI, BTI, charge-trap formation and electromigration generally reduces the intrinsic speed of a transistor and the circuit in which the transistor is employed. In early stages of degradation, the circuit speed may be restored by increasing the voltage at which the circuit is driven. Later on, after the drive voltage has been raised as far as possible, the frequency at which the circuit is driven speeds should be reduced to accommodate the ever-decreasing circuit speed. Eventually, however, the circuit will begin to behave erratically and will eventually cease to function at all.

Degradation tends to become more predominant as new technologies have allowed the sizes of transistors, other components and interconnects to become ever smaller. Various techniques have been devised to detect and compensate for IC degradation. Those techniques have been more or less successful at increasing IC performance, extending IC life or predicting impending IC failure.

SUMMARY

One aspect provides a degradation detector for an IC. In one embodiment, the degradation detector includes: (1) an offline ring oscillator (RO) coupled to a power gate and a clock gate, (2) a frozen RO coupled to a clock gate, (3) an online RO and (4) an analyzer coupled to the offline RO, the frozen RO and the online RO and operable to place the degradation detector in a normal state in which the offline RO is disconnected from both the drive voltage source and the clock source, the frozen RO is connected to the drive voltage source but disconnected from the clock source and the online RO is connected to both the drive voltage source and the clock source.

Another aspect provides a method of detecting aging in an IC. In one embodiment, the method includes: (1) entering a normal state, including: (1a) providing neither a drive voltage nor a clock signal to an offline RO, (1b) providing the drive voltage but not the clock signal to a frozen RO and (1c) providing both the drive voltage and the clock signal to an online RO and (2) entering a detection state from the normal state, the detection state including: (2a) providing both the drive voltage and the clock signal to the offline RO, (2b) providing both the drive voltage and the clock signal to the frozen RO and (2c) providing both the drive voltage and the clock signal to the online RO.

Yet another aspect provides an IC. In one embodiment, the IC includes: (1) memory, (2) other integrated circuitry and (3) first and second power domains encompassing the memory and the other integrated circuitry, the memory being associated with a first degradation detector and the other integrated circuitry being associated with a second degradation detector. Each degradation detector includes: (3a) an offline RO coupled to a power gate and a clock gate, (3b) a frozen RO coupled to a clock gate, (3c) an online RO and (3d) an analyzer coupled to the offline RO, the frozen RO and the online RO and operable to place the degradation detector in a normal state in which the offline RO is disconnected from both the drive voltage source and the clock source, the frozen RO is connected to the drive voltage source but disconnected from the clock source and the online RO is connected to both the drive voltage source and the clock source, inverters in the offline RO, the frozen RO and the online RO of the first degradation detector being of a same architecture as the memory, inverters in the offline RO, the frozen RO and the online RO of the second degradation detector being of a same architecture as the other integrated circuitry.

BRIEF DESCRIPTION

Reference is now made to the following descriptions taken in conjunction with the accompanying drawings, in which.

DETAILED DESCRIPTION

Figure 1:
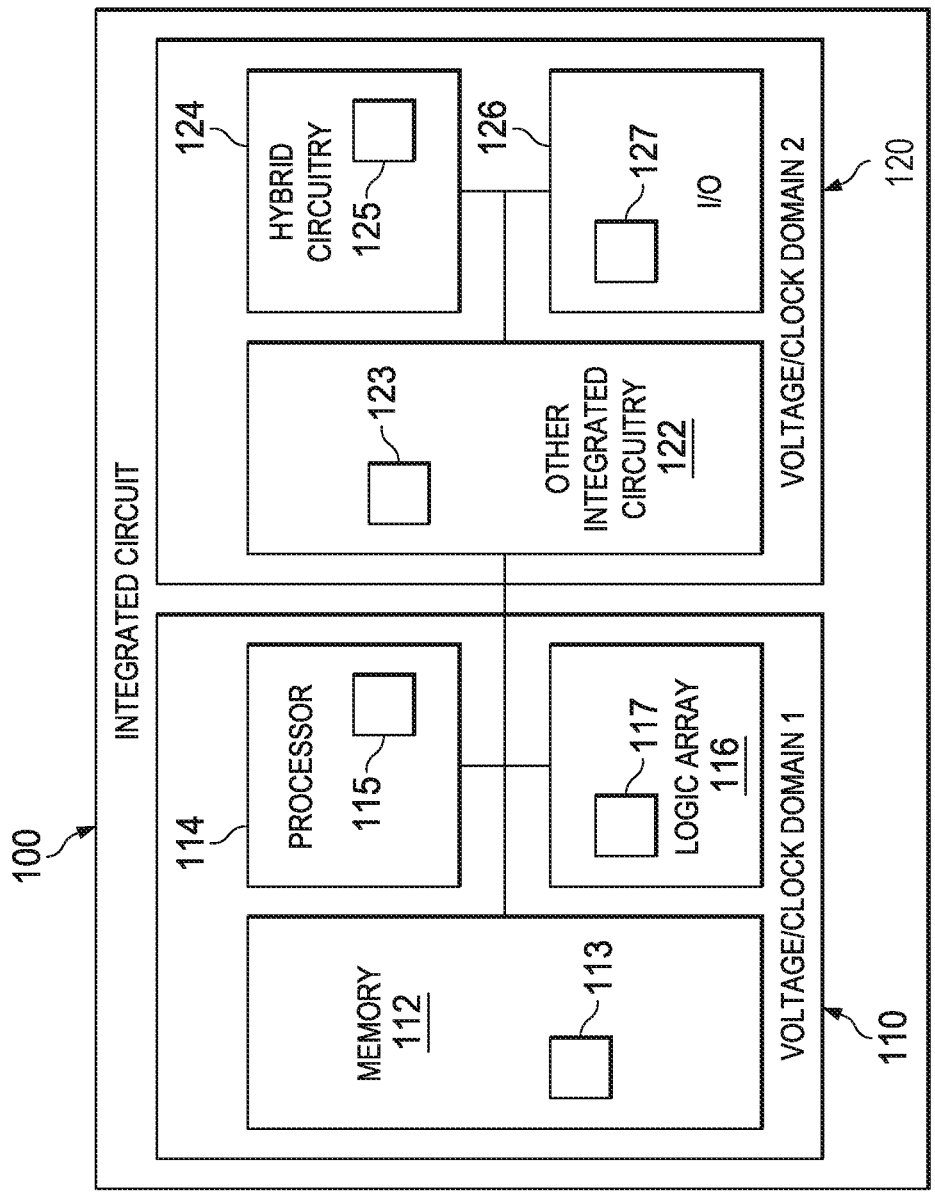
FIG. 1 is a high-level block diagram of one example of an IC having multiple voltage and/or clock domains and various types of integrated circuitry located thereon.

As stated above, various techniques have been devised to detect and compensate for IC degradation. The techniques have mostly centered around using an RO as a speedometer. As those skilled in the pertinent art are familiar, an RO is constructed by series-coupling an odd number of inverters in a loop. An input state of one of the inverters is toggled, causing a cascading state change in each subsequent inverter that resonates around the RO at a frequency that is largely a function of the speeds of the transistors making up the inverters. If the RO is working properly, it will provide an output frequency that favorably compares with a stored reference number. If the comparison is favorable, decreases in drive voltage, increases in clock frequency, or some combination thereof, may be in order, perhaps until the comparison becomes unfavorable. If the output frequency is less than the reference, the RO has degraded to some degree, and increases in drive voltage, perhaps leading to eventual decreases in clock speed, may be in order.

Some of the above-referenced techniques are directed to detecting BTI. BTI is especially difficult to detect, because it is exhibited only briefly after the voltage that has been applied to a control terminal over time has been interrupted. To detect the barely-detectible, one technique employs dual ROs to generate a beat frequency: one RO that has been subjected to BTI, and another RO that has not (see, Keane, et al., "Transistor Aging," IEEE Spectrum, http://spectrum.ieee.org/semiconductors/processors/transistor-aging, posted 25 Apr. 2011). Nevertheless, a comprehensive technique for accurately detecting the causes of transistor degradation has been elusive.

It is realized herein that transistor degradation occurs as a result of use, and degradation is most accurately measured when the reference against which it is measured is appropriate. It is therefore realized that the reference used to gauge the performance of an RO should be a reference RO instead of a stored reference number and that the reference RO should be rendered inoperable when detection is not being performed so the reference RO can be preserved to be close to its originally fabricated state.

It is yet further realized herein that, while the output frequency an RO generates is a trusted indicator of degradation, the duty cycle of the frequency also helps in diagnosing the type of degradation taking place. It is still further realized herein that known boundary scan techniques can be employed to initiate and read out the results of degradation detection.

It is yet still further realized herein that a degradation detector can be made more accurate when its inverters are of the same architecture as the integrated circuitry with which it is associated. For example, a degradation detector for dynamic random-access memory (DRAM) should use DRAM cells in its inverters. Likewise, a degradation detector for a field-programmable gate array (FPGA) should use programmable gates in its inverters.

It is still yet further realized that degradation detectors may advantageously be placed in multiple voltage domains, multiple clock domains, or both, in an IC having multiple domains, since degradation tends to occur at different rates, depending upon drive voltage, clock rate and the technologies employed to fabricate the various IC domains.

Described herein are various embodiments of a degradation detector and a method of detecting the aging of integrated circuitry. The various embodiments take advantage of one or more of the realizations described above.

FIG. 1 is a high-level block diagram of one example of an IC 100 having multiple voltage and/or clock domains. Illustrated are a first voltage and/or clock domain 110 and a second voltage and/or clock domain 120. The first voltage and/or clock domain 110 is illustrated as including a memory 112, a processor 114 and a logic array 116. The memory 112 may be DRAM, static random-access memory (SRAM), read-only memory (ROM), programmable ROM (PROM) or any other conventional or later-developed memory type. The processor 114 may be a microprocessor, microcontroller, parallel processor, special-purpose (e.g., graphics) processor or any other conventional or later-developed processor type. The logic array 116 be a field-programmable gate array (FPGA), a programmable logic array (PLA) a programmable array logic (PAL) or any other convention or later-developed type of logic array.

The second voltage and/or clock domain 120 is illustrated as including other integrated circuitry 122 of unspecified type, hybrid (analog/digital) circuitry 124 and input/output (I/O) circuitry 126. The other integrated circuitry 122 may be any circuitry that can be integrated onto a common substrate either now or in the future. The hybrid circuitry 124 may include digital-to-analog converters (DACs), analog-to-digital converters (DCAs) or analog circuitry that can be integrated onto a common substrate either now or in the future. The input/output (I/O) circuitry 126, may include drivers, receivers, latches, buffers and serializers/deserializers (SERDESs) of various conventional or later-developed types.

Each of the memory 112, the processor 114, the logic array 116, the other integrated circuitry 122, the hybrid circuitry 124 and the I/O circuitry 126 has associated with it a respective degradation detector 113, 115, 117, 123, 125, 127. In the illustrated embodiment, ROs (not shown) in each degradation detector 113, 115, 117, 123, 125, 127 employ inverters (not shown) that are of the same type as the circuitry of the portion of the IC in which each degradation detector 113, 115, 117, 123, 125, 127 lies (i.e. the memory 112, the processor 114, the logic array 116, the other integrated circuitry 122, the hybrid circuitry 124 and the I/O circuitry 126, respectively). For example, the ROs (not shown) of the degradation detector 113 employ memory cells, and the ROs (not shown) of the I/O circuitry 122 employ drivers or receivers.

Figure 2:
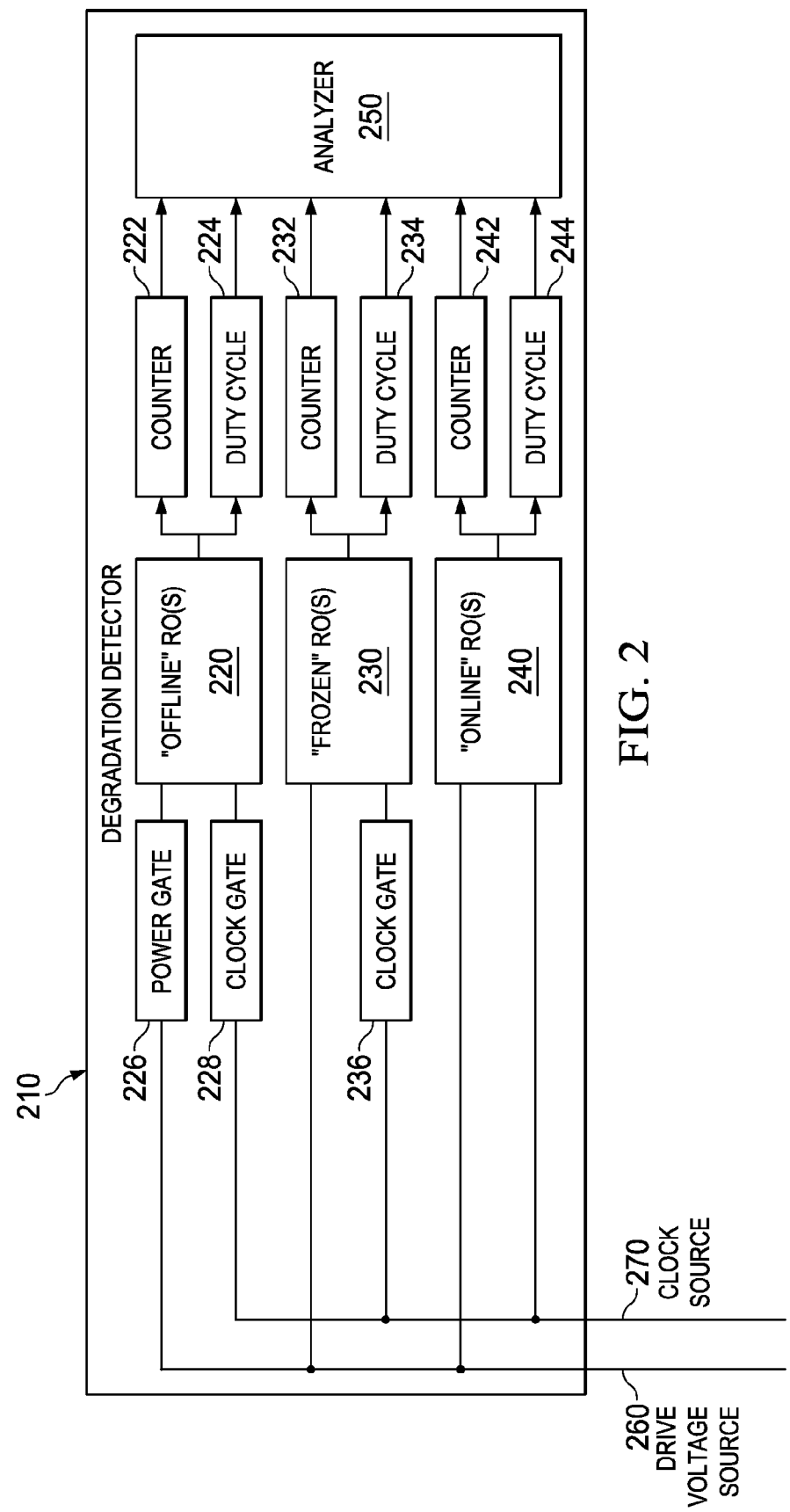
FIG. 2 is a block diagram of one embodiment of a degradation detector for detecting the aging of integrated circuitry.

Irrespective of the type of circuitry constituting the inverters in the ROs of the degradation detectors 113, 115, 117, 123, 125, 127, the overall architecture of the degradation detectors 113, 115, 117, 123, 125, 127 may remain the same. FIG. 2 is a block diagram of one embodiment of a degradation detector 210 for detecting the aging of integrated circuitry. The illustrated embodiment of the degradation detector 210 includes one or more "offline" ROs 220, one or more "frozen" ROs 230 and one or more "aging" ROs 240. In the illustrated embodiment, the one or more "offline" ROs 220, the one or more "frozen" ROs 230 and the one or more "aging" ROs 240 are of the same architecture and fabricated using the same types and sizes of transistor such that they ideally operate identically. In the illustrated embodiment, the one or more "offline" ROs 220, the one or more "frozen" ROs 230 and the one or more "aging" ROs 240 contain inverters (not shown) having the same architecture as the integrated circuitry with which it is associated. For example, the degradation detector 115 uses gates that are of the same architecture as those used in the processor 114.

It is possible, however, that fabrication variations may cause the one or more "offline" ROs 220, the one or more "frozen" ROs 230 and the one or more "aging" ROs 240 to oscillate differently in the absence of aging. Accordingly, some embodiments of the degradation detector 210 employ fuses or other compensating mechanisms to alter the operation of the one or more "offline" ROs 220, the one or more "frozen" ROs 230 and the one or more "aging" ROs 240 or indicate how the results of their operation should be compensated to become valid.

The one or more offline ROs 220, the one or more frozen ROs 230 and the one or more online ROs 240 are coupled to respective output counters 222, 232, 242 and duty cycle detectors 224, 234, 244 at outputs thereof. Only one counter 222, 232, 242 and one duty cycle detector 224, 234, 244 is shown for each of the ROs 220, 230, 240; however, those skilled in the pertinent art will understand that other embodiments may have more counters 222, 232, 242 and/or duty cycle detectors 224, 234, 244. The counters 222, 232, 242 are operable to contain numbers that depend upon the output frequency of their corresponding ROs 220, 230, 240. The duty cycle detectors 224, 234, 244 are operable to contain numbers that depend upon the duty cycles of the output of their corresponding ROs 220, 230, 240. "Duty cycle" is defined for purposes of this disclosure as the proportion (e.g., percentage) of time an RO output is in a particular logic state, e.g., a logic one state. An ideal binary RO that has suffered no degradation should have a duty cycle of 0.5, or 50%, meaning that its output spends exactly as much time in a logic one state as it does in a logic zero state.

An analyzer 250 is coupled to the counters 222, 232, 242 and the duty cycle detectors 224, 234, 244 and is operable to reset and read the counters 222, 232, 242 and the duty cycle detectors 224, 234, 244 and open or close the power gate 226 and the clock gates 236. Although FIG. 2 depicts the analyzer 250 as a block of circuitry, alternative embodiments embody the analyzer as software or firmware executing on a processor or controller and communicating with the gates 226, 228, 236, the counters 222, 232, 242 and the duty cycle detectors 224, 234, 244 remotely, perhaps using a test scanning technique, such as that devised by the Joint Test Action Group (JTAG), in which registers would be employed to open and close the gates 226, 228, 236 and reset and read the counters 222, 232, 242 and the duty cycle detectors 224, 234, 244.

As implied above, the one or more offline ROs 220 are provided with both a power gate 226 and a clock gate 228. The power gate 226 is operable to disconnect the one or more offline ROs 220 from a drive voltage source 260, and the clock gate 228 is operable to disconnect the one or more offline ROs 220 from a clock source 270, rendering the one or more offline ROs 220 inoperable, hence the term, "offline."

In contrast, the one or more frozen ROs 230 are coupled to the drive voltage source 260 persistently, no power gate is provided to disconnect the one or more clock-gated ROs 220. However, the one or more frozen ROs 230 are provided with a clock gate 236. The clock gate 236 is operable to disconnect the one or more frozen ROs 230 from the clock source 270, which places the one or more frozen ROs 230 in a "frozen" state, defined as a state in which transistors in the one or more frozen ROs 230 initially assume logic one and logic zero levels, but clock-driven logic transitions (including oscillations in the one or more frozen ROs 230) cannot thereafter occur. The initially-assumed logic one and logic zero levels remain in place, hence the term, "frozen."

In further contrast, the one or more online ROs 240 are coupled to both the drive voltage source 260 and the clock source 270 persistently, no power gate or clock gate is provided to disconnect the one or more clock-gated ROs 220. Consequently, the one or more online ROs 240 oscillate as the IC (100 of FIG. 1) as a whole operates, aging as time marches on, hence the term, "online."

The operation of the degradation detector 210 embodiment of FIG. 2 will now be described. The degradation detector 210 has two states: a normal state and a detection state. It is expected that the degradation detector 210 will usually operate in the normal state, perhaps just short of 100% of the time and that the detection state will be assumed only occasionally and only as long as necessary to gather data indicating degradation. Of course, no practical limit exists to the amount of time that may be spent operating in the detection state. However, those skilled in the pertinent art will come to understand that operating in the detection state is likely to age the one or more offline ROs 220, mitigate BTI in the one or more frozen ROs 230 and reduce the contrast in operation among the one or more offline ROs 220, the one or more frozen ROs 230 and the one or more online ROs 240.

In the normal state, an analyzer 250 coupled to the counters 222, 232, 242 and the duty cycle detectors 224, 234, 244 closes the power gate 226 and the clock gates 228, 236. Thus, the one or more offline ROs 220 are disconnected from both the drive voltage source 260 and the clock source 270 and are inoperable. In contrast, the one or more frozen ROs 230 are disconnected from only the clock source 280, causing them to be placed in a frozen state in which logic one and logic zero levels, once initially entered, are maintained persistently in the transistors of the inverters of the one or more frozen ROs 230.

In further contrast, the one or more online ROs 240 remain connected to the drive voltage source 260 and the clock source 270 and thus operate and oscillate at their inherent frequency, which, assuming a constant drive voltage, typically declines as the one or more online ROs 240 age.

In the detection state, the analyzer 250 opens the power gate 226 and the clock gates 228, 236. This turns on the one or more offline ROs 220, causing them to begin oscillating and further causes the one or more frozen ROs 230 to begin oscillating. The one or more online ROs 240 continue operating and oscillating as before in the normal state.

To begin detection, the counters 222, 232, 242 and the duty cycle detectors 224, 234, 244 are reset and begin to count and accrue duty cycle statistics. Over some test interval, which may be selected based on a host of factors that depend upon a particular IC and perhaps its environment, the numbers in the counters 222, 232, 242 and the duty cycle detectors 224, 234, 244 are read and analyzed to determine degradation.

If the IC is relatively young, the numbers read from the counters 222, 232, 242 should be close to (e.g., within 1% of) one another, and the numbers read from the duty cycle detectors 224, 234, 244 should likewise be similar and very close to 0.5.

Assuming that some time has passed (e.g., a few years), it may be observed that the numbers read from the counter 222 may substantially exceed (e.g., be more than 105% of) the numbers read from the counters 232, 242. Degradation may be setting in, and drive voltage to the IC may need to be increased to compensate for it, or the clock rate may need to be decreased to accommodate it.

Additional or alternative analyses are possible. For example, the number read from the counter 222 may substantially exceed the number read from the counter 242, or the number read from the duty cycle detector 224 may differ substantially from the number read from the duty cycle detector 244, providing at least some indication that aging due to HCI, charge-trap formation or electromigration has occurred.

The number read from the counter 222 may substantially exceed the number read from the counter 232, indicating that aging due to BTI has occurred. Additionally, deviation in the number read from the duty cycle detector 234 may indicate whether the BTI is positive or negative. In one embodiment, at least two ROs are included in the frozen ROs 230. One RO is fabricated such that it is biased to provide maximum positive BTI stress. The other RO is fabricated such that it is biased to provide maximum negative BTI stress. This arrangement may provide additional data regarding aging.

If, for example, the degradation detector in question happens to be the degradation detector 113, a legitimate concern may arise that certain portions of the associated memory 112 that tend not to change state often (e.g., those storing instructions or constants) may be in danger of losing their ability to respond to attempted writes at an acceptable speed. Mitigating the concern may involve exercising at least those portions of the memory 112 by toggling them, moving more persistent data to other portions of the memory 112 or issuing a warning of some sort.

Toward the end of the life of the IC, the numbers read from the counters 222, 232, 242 may be quite disparate from one another and/or the numbers read from the duty cycle detectors 234, 244 may vary substantially from the number read from the duty cycle detector 224 or an ideal 0.5. Assuming that the drive voltage of the IC has already been increased to a maximum, and clock speeds have already been throttled back, rather extreme actions may be taken, such as issuing a strong warning or disabling all or portions of the IC, perhaps delegating the functions that the IC performs to other ICs.

Those skilled in the pertinent art will see broad variety of ways not only to analyze and interpret the numbers read out from the counters 222, 232, 242 and the duty cycle detectors 224, 234, 244, but also to act in response to the analysis and interpretation. Those skilled in the pertinent art will also understand that circuits other than counters and duty cycle detectors may be coupled to the ROs 220, 230, 240 to provide additional data regarding their operation. For example, Kumar (cited above and incorporated herein by reference) is replete with information regarding how IC degradation may be quantified. Those skilled in the pertinent art will readily be able to adapt the teachings in Kumar to the degradation detector and method introduced herein.

Figure 3:
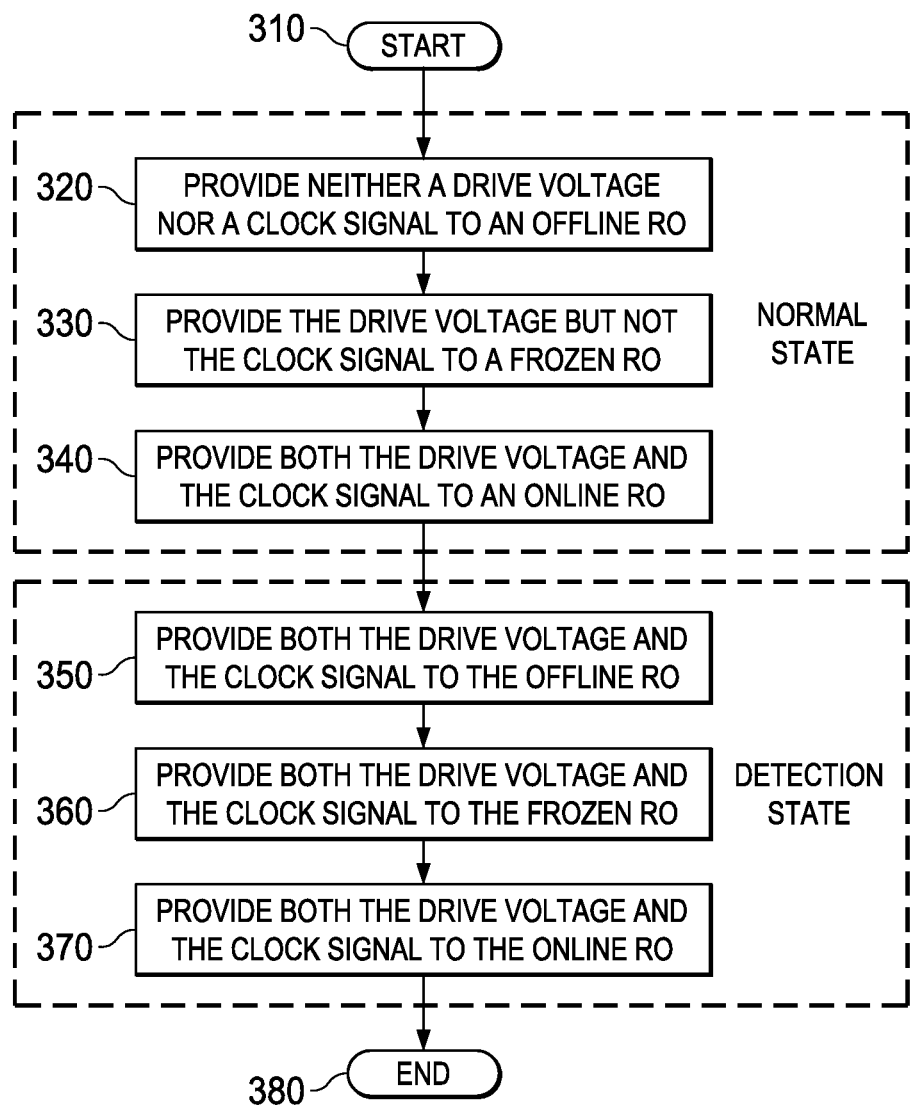
FIG. 3 is a flow diagram of one embodiment of a method of detecting the aging of integrated circuitry.

FIG. 3 is a flow diagram of one embodiment of a method of detecting the aging of integrated circuitry. The method begins in a start step 310. Steps 320, 330, 340 pertain to a normal state of operation. In the step 320, neither a drive voltage nor a clock signal is provided to an offline RO. In the step 330, the drive voltage is provided to a frozen RO, but not the clock signal. In the step 340, both the drive voltage and the clock signal are provided to an online RO. Steps 350, 360, 370 pertain to a detection state. Upon entering the detection state, counters and duty cycle detectors associated with the offline, frozen and online ROs detectors are reset and begin to gather data. In the step 350, both the drive voltage and the clock signal are provided to the offline RO. In the step 360, both the drive voltage and the clock signal are provided to the frozen RO. In the step 370, both the drive voltage and the clock signal are provided to the online RO. After the passage of some time, numbers from the counters and the duty cycle detectors are analyzed to determine whether or not IC aging has taken place. If such aging has taken place, a variety of mitigating or warning steps may be taken. The method ends in an end step 380.

Those skilled in the art to which this application relates will appreciate that other and further additions, deletions, substitutions and modifications may be made to the described embodiments.

What is claimed is:

1. A degradation detector for an integrated circuit, comprising:
an offline ring oscillator coupled to a drive voltage source via a power gate and a clock source via a first clock gate;
a frozen ring oscillator coupled to a second clock gate;
an online ring oscillator persistently coupled to said drive voltage source and said clock source; and
an analyzer coupled to said offline ring oscillator, said frozen ring oscillator and said online ring oscillator and operable to place said degradation detector in a normal state in which said offline ring oscillator is disconnected from both said drive voltage source and said clock source, said frozen ring oscillator is connected to said drive voltage source but disconnected from said clock source and said online ring oscillator is connected to both said drive voltage source and said clock source.

2. The degradation detector as recited in claim 1 wherein said degradation detector is associated with other integrated circuitry, inverters in said offline ring oscillator, said frozen ring oscillator and said online ring oscillator being of a same architecture as said other integrated circuitry.

3. The degradation detector as recited in claim 1 wherein said analyzer is further operable to place said degradation detector in a detection state in which said offline ring oscillator, said frozen ring oscillator and said online ring oscillator are connected to both said drive voltage source and said clock source.

4. The degradation detector as recited in claim 1 further comprising counters coupled to said offline ring oscillator, said frozen ring oscillator and said online ring oscillator and operable to provide numbers to said analyzer.

5. The degradation detector as recited in claim 1 further comprising duty cycle detectors coupled to said offline ring oscillator, said frozen ring oscillator and said online ring oscillator and operable to provide numbers to said analyzer.

6. The degradation detector as recited in claim 1 wherein said frozen ring oscillator is biased to provide maximum positive BTI stress and said degradation detector further comprises another frozen ring oscillator biased to provide maximum negative BTI stress.

7. The degradation detector as recited in claim 1 wherein said analyzer is further operable to provide a signal indicating an aging of said integrated circuit.

8. A method of detecting aging in an integrated circuit, comprising:
entering a normal state, including:
providing neither a drive voltage nor a clock signal to an offline ring oscillator,
providing said drive voltage but not said clock signal to a frozen ring oscillator, and
providing both said drive voltage and said clock signal to an online ring oscillator; and
entering a detection state from said normal state, said detection state including:
providing both said drive voltage and said clock signal to said offline ring oscillator,
providing both said drive voltage and said clock signal to said frozen ring oscillator, and
providing both said drive voltage and said clock signal to said online ring oscillator.

9. The method as recited in claim 8 wherein said offline ring oscillator, said frozen ring oscillator and said online ring oscillator are associated with other integrated circuitry, inverters in said offline ring oscillator, said frozen ring oscillator and said online ring oscillator being of a same architecture as said other integrated circuitry.

10. The method as recited in claim 8 further comprising providing numbers from counters coupled to said offline ring oscillator, said frozen ring oscillator and said online ring oscillator in said detection state.

11. The method as recited in claim 8 further comprising providing numbers from duty cycle detectors coupled to said offline ring oscillator, said frozen ring oscillator and said online ring oscillator in said detection state.

12. The method as recited in claim 8 wherein said frozen ring oscillator is biased to provide maximum positive BTI stress and said degradation detector further comprises another frozen ring oscillator biased to provide maximum negative BTI stress.

13. The method as recited in claim 8 further comprising providing a signal indicating an aging of said integrated circuit.

14. An integrated circuit, comprising:
  memory;
  other integrated circuitry; and
  first and second power domains encompassing said memory and said other integrated circuitry, said memory being associated with a first degradation detector and said other integrated circuitry being associated with a second degradation detector, each said degradation detector including:
    an offline ring oscillator coupled to a drive voltage source via a power gate and a clock source via a first clock gate,
    a frozen ring oscillator coupled to a second clock gate,
    an online ring oscillator oscillator persistently coupled to said drive voltage source and said clock source, and
    an analyzer coupled to said offline ring oscillator, said frozen ring oscillator and said online ring oscillator and operable to place said degradation detector in a normal state in which said offline ring oscillator is disconnected from both said drive voltage source and said clock source, said frozen ring oscillator is connected to said drive voltage source but disconnected from said clock source and said online ring oscillator is connected to both said drive voltage source and said clock source, inverters in said offline ring oscillator, said frozen ring oscillator and said online ring oscillator of said first degradation detector being of a same architecture as said memory, inverters in said offline ring oscillator, said frozen ring oscillator and said online ring oscillator of said second degradation detector being of a same architecture as said other integrated circuitry.

15. The integrated circuit as recited in claim 14 further comprising first and second clock domains.

16. The integrated circuit as recited in claim 14 wherein said analyzer is further operable to place said degradation detector in a detection state in which said offline ring oscillator, said frozen ring oscillator and said online ring oscillator are connected to both said drive voltage source and said clock source.

17. The integrated circuit as recited in claim 14 wherein said degradation detector further comprising counters coupled to said offline ring oscillator, said frozen ring oscillator and said online ring oscillator and operable to provide numbers to said analyzer.

18. The integrated circuit as recited in claim 14 wherein said degradation detector further comprising duty cycle detectors coupled to said offline ring oscillator, said frozen ring oscillator and said online ring oscillator and operable to provide numbers to said analyzer.

19. The integrated circuit as recited in claim 14 wherein said frozen ring oscillator is biased to provide maximum positive BTI stress and said degradation detector further comprises another frozen ring oscillator biased to provide maximum negative BTI stress.

20. The integrated circuit as recited in claim 14 wherein said analyzer is further operable to provide a signal indicating an aging of said integrated circuit.

\* \* \* \* \*